United States Patent
Kimura

(10) Patent No.: US 7,659,629 B2
(45) Date of Patent: Feb. 9, 2010

(54) SEMICONDUCTOR INTEGRATED CIRCUIT

(75) Inventor: Yoshitaka Kimura, Mihama-ku (JP)

(73) Assignee: Kawasaki Microelectronics, Inc., Mihama-ku (JP)

( * ) Notice: Subject to any disclaimer, the term of this patent is extended or adjusted under 35 U.S.C. 154(b) by 338 days.

(21) Appl. No.: 11/594,063

(22) Filed: Nov. 8, 2006

(65) Prior Publication Data

US 2007/0102820 A1 May 10, 2007

(30) Foreign Application Priority Data

Nov. 10, 2005 (JP) ............................ 2005-325508

(51) Int. Cl.
*H01L 23/52* (2006.01)
(52) U.S. Cl. .............. 257/758; 257/E23.144; 257/776; 257/691
(58) Field of Classification Search .............. 257/758, 257/700, 776
See application file for complete search history.

(56) References Cited

U.S. PATENT DOCUMENTS

| | | | |
|---|---|---|---|
| 6,849,920 B2 | 2/2005 | Ozawa | |
| 2002/0149116 A1* | 10/2002 | Kusumoto | ................. 257/777 |
| 2003/0209727 A1* | 11/2003 | Ohayashi et al. | ............ 257/200 |
| 2004/0228066 A1 | 11/2004 | Sakurabayashi et al. | |

FOREIGN PATENT DOCUMENTS

| | | |
|---|---|---|
| JP | 09-064284 | 3/1997 |
| JP | 2001-339169 | 12/2001 |
| JP | 2002-270771 | 9/2002 |
| JP | 2003-124334 | 4/2003 |
| JP | 2003-249559 | 9/2003 |
| JP | 2003-324153 | 11/2003 |
| JP | 2004-104136 | 4/2004 |
| JP | 2004-342924 | 12/2004 |

\* cited by examiner

*Primary Examiner*—Sue Purvis
*Assistant Examiner*—Krista Soderholm
(74) *Attorney, Agent, or Firm*—Oliff & Berridge, PLC

(57) ABSTRACT

A semiconductor integrated circuit having a multilayer wiring structure is provided which includes: a top metal wiring layer ($M_{TOP}$) including a plurality of top layer power supply wirings and a next-to-top metal wiring layer ($M_{TOP-1}$) directly below the top metal wiring layer $M_{TOP}$ including a plurality of next-to-top layer power supply wirings. Each of the top layer and the next-to-top layer power supply wirings also includes first potential wirings for supplying a first potential to the circuit elements and second potential wirings for supplying a second potential to the circuit elements. The top layer power supply wirings and the next-to-top layer power supply wirings cross each other and have a top layer insulating film disposed between them. First and second contacts are provided in the insulating film for connecting the first potential wirings and second potential wirings in the top and the next-to-top metal wiring layers with each other.

15 Claims, 3 Drawing Sheets

SEMICONDUCTOR INTEGRATED CIRCUIT

CROSS-REFERENCE TO RELATED APPLICATION

This application claims priority from Japanese Application No. 2005-325508, filed Nov. 10, 2005, which is incorporated by reference in its entirety.

BACKGROUND

The present invention relates to a semiconductor integrated circuit operating at a low voltage and a high speed, and particularly to a semiconductor integrated circuit capable of stabilizing an operating power supply.

In a semiconductor integrated circuit, power supply wiring and ground wiring, which are sufficiently decreased in resistance, are laid in the circuit, for supplying a specified voltage to each element and stabilizing the operation of each element in the circuit. However, when high power consumption locally occurs in the semiconductor integrated circuit, a power supply voltage is instantaneously decreased in its vicinity. As a result, operation errors in logical circuits or jitters in output signals occur. Such a phenomenon significantly occurs in a semiconductor integrated circuit operating at a high speed and a low power supply voltage.

Methods generally used for resolving these problems include those in which power supply wiring and ground wiring are strengthened, i.e., wiring is thickened to decrease the resistance, and those in which a capacitor is formed between a power supply and a ground, in order to stabilize a power supply voltage for instantaneous power consumption. Examples of these methods are known as below:

(1) One of a top metal wiring layer (layer n) and a wiring layer (layer n−1) directly below the top metal wiring layer is connected to a high-voltage power supply $V_{DD}$. The other is connected to a low-voltage power supply $V_{SS}$, and an insulating material having a relatively high dielectric constant is formed thinly between these two wiring layers. As a result, a capacitor cell is formed which stabilizes a power supply using the wiring layers of n and n−1 as electrodes. (Japanese Laid-open Patent Application 2002-270771).

(2) The wiring layers of M1, M2, and M3 are laminated so that the pitch array direction of a plurality of wirings arrayed at a pitch in the same direction crosses that of a plurality of other wirings arrayed at a pitch in the same direction. The wiring layers of M1, M2, and M3 are connected to each other so that potentials $V_{DD}$ and $V_{SS}$ are supplied to the adjacent wirings in each of the wiring layers M1, M2, and M3. As a result, decoupling capacitance is formed between the adjacent $V_{DD}$ and $V_{SS}$ wirings in each of the wiring layers. (Japanese Laid-open Patent Application 2003-249559).

However, in the method disclosed in JP 2002-270771, a capacitor cell to power supply wiring is usually required to be added. Therefore, it has the problem of requiring two wiring layers and increasing the manufacturing cost compared with a general semiconductor integrated circuit.

In the method disclosed in JP 2003-249559, a capacitor between the $V_{DD}$ and $V_{SS}$ wirings in the same layer is formed. It has the problem that it cannot provide sufficient electrode area from a structural point of view, and causes difficulty in securing enough capacitance, and particularly the problem of failing to form a large capacitor when the number of signal wirings is increased.

SUMMARY

Accordingly, a semiconductor integrated circuit is provided that is capable of maintaining a sufficient power supply capacitance and stabilizing a power supply voltage without complicating the manufacturing process and increasing the manufacturing cost.

A semiconductor integrated circuit according to an exemplary embodiment may have the following characteristics:

a semiconductor integrated circuit having a multilayer wiring structure, including:

circuit elements formed on a semiconductor substrate;

a top metal wiring layer ($M_{TOP}$) including a plurality of top layer power supply wirings extending in a first direction, and a next-to-top metal wiring layer ($M_{TOP-1}$) directly below the top metal wiring layer $M_{TOP}$ including a plurality of next-to-top layer power supply wirings extending in a second direction, each of the top layer and the next-to-top layer power supply wirings including a plurality of first potential wirings for supplying a first potential to the circuit elements and a plurality of second potential wirings for supplying a second potential to the circuit elements, the first direction and the second direction being configured such that the top layer power supply wirings and the next-to-top layer power supply wirings cross each other with a top layer insulating film disposed between there; and a plurality of first contacts provided in the insulating film for connecting the first potential wirings in the top and the next-to-top metal wiring layers with each other and a plurality of second contacts provided in the insulating film for connecting the second potential wirings in the top and the next-to-top metal wiring layers with each other.

The semiconductor integrated circuit may also include a plurality of lower metal wiring layers located below the next-to-top metal wiring layer, wherein capacitance per unit area formed between the top layer power supply wirings and the next-to-top layer power supply wirings is larger than a capacitance per unit area between wirings of any two of the metal wiring layers other than the top metal wiring layer $M_{TOP}$ and the next-to-top metal wiring layer $M_{TOP-1}$.

The semiconductor integrated circuit is capable of maintaining a sufficient power supply capacitance and stabilizing a power supply voltage without complicating the manufacturing process and increasing the manufacturing cost.

DETAILED DESCRIPTION OF EMBODIMENTS

Figure 1:
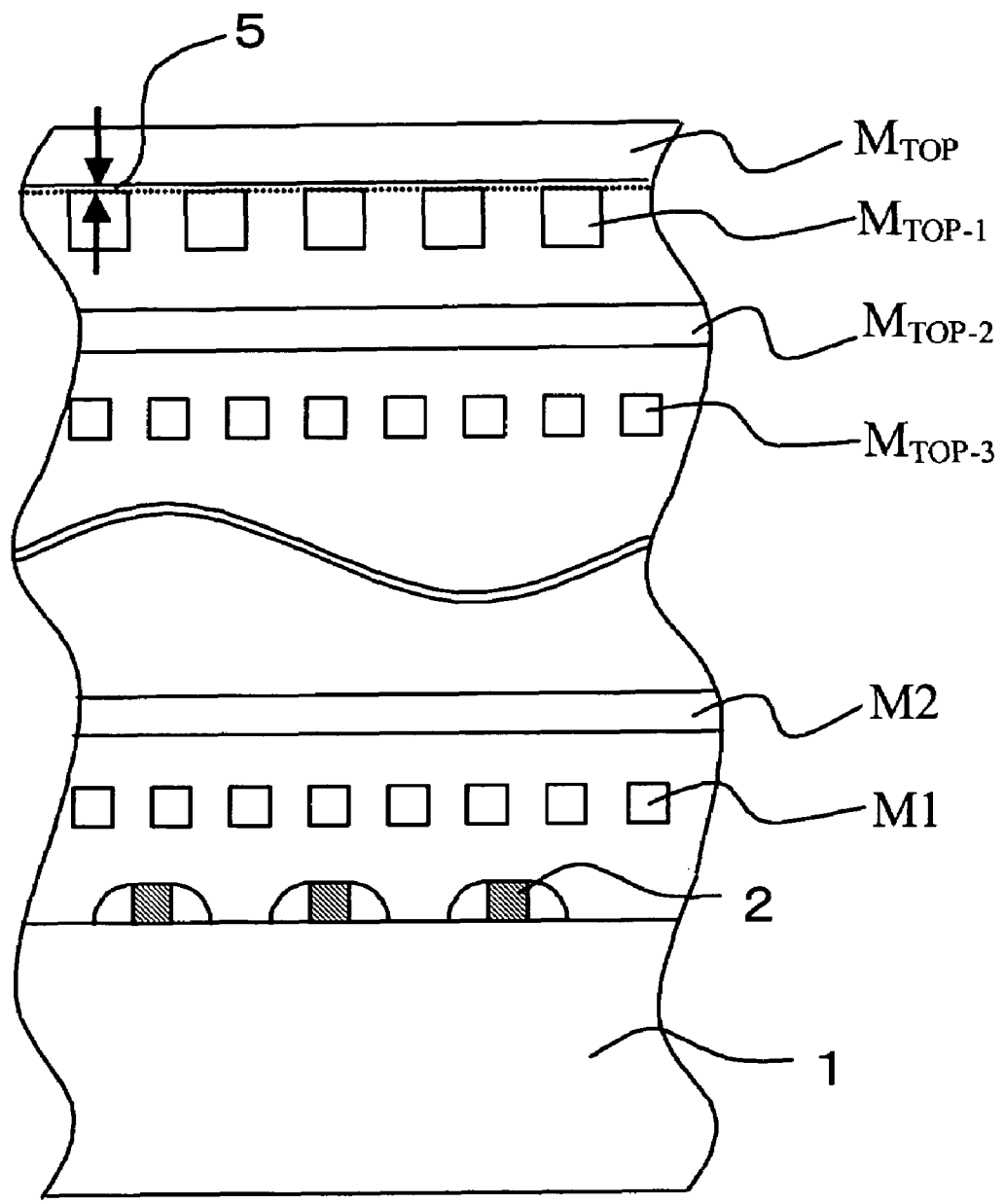
FIG. 1 is a cross-sectional view showing a semiconductor integrated circuit according to an exemplary embodiment.

Various exemplary embodiments will be explained in detail below. FIG. 1 is a cross-sectional view showing a semiconductor integrated circuit according to an exemplary embodiment. As shown in FIG. 1, the semiconductor integrated circuit includes a plurality of elements 2, such as MOSFET formed on the surface of a semiconductor substrate 1, and metal wiring layers such as M1 and M2 for connecting the elements together in order to have the predetermined semiconductor integrated circuits function. The semiconductor integrated circuits are connected by the metal wirings included in the metal wiring layers.

FIG. 1 shows the semiconductor integrated circuit having a multilayer wiring structure including metal wiring layers $M_1$ to $M_{TOP}$ as the metal wiring layers mentioned above. The top metal wiring layer ($M_{TOP}$) includes a plurality of top layer power supply wirings extending in a first direction. The next-to-top metal wiring layer ($M_{TOP-1}$), which is located directly below the top metal wiring layer $M_{TOP}$, includes a plurality of next-to-top layer power supply wirings extending in a second direction.

Each of the $M_{TOP}$ and $M_{TOP-1}$ layers includes a plurality of first potential wirings for supplying a first potential "$V_{CC}$" to the circuit elements and a plurality of second potential wirings for supplying a second potential "$V_{SS}$", which is different from $V_{CC}$, to the circuit elements. The first potential wirings for supplying a first potential "$V_{CC}$" are connected to a power supply for supplying a power supply voltage to the circuit. The second potential wirings for supplying a second potential "$V_{SS}$" are connected to a ground for supplying a ground potential.

The first direction of the $M_{TOP}$ layer and the second direction of the $M_{TOP-1}$ layer are different with respect to each other such that the top layer power supply wirings included in the $M_{TOP}$ layer and the next-to-top layer power supply wirings included in the $M_{TOP-1}$ layer cross each other with a top layer insulating film disposed between them.

A plurality of first contacts is provided in the insulating film for connecting the first potential wirings included in the $M_{TOP}$ and $M_{TOP-1}$ layers with each other. A plurality of second contacts is also provided in the insulating film for connecting the second potential wirings in the top and the next-to-top metal wiring layers with each other.

When the semiconductor integrated circuit is observed from the top direction (i.e., in the top view), the plurality of the top layer power supply wirings included in the $M_{TOP}$ layer and the plurality of the next-to-top layer power supply wirings included in the $M_{TOP-1}$ layer are arranged to cross each other with the top layer insulating film provided between them.

Figure 2:
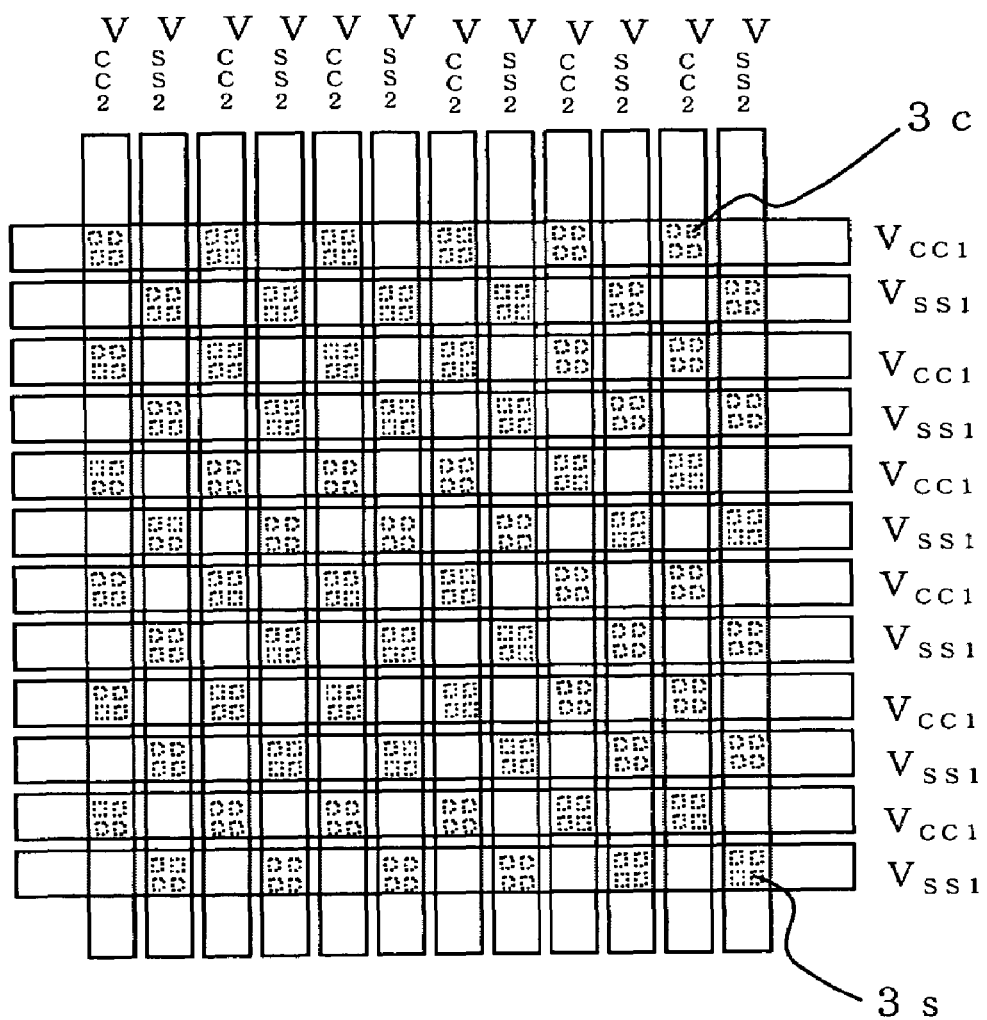
FIG. 2 is a conceptual top view showing a wiring arrangement in which power supply wirings ($V_{CC1}$ and $V_{SS1}$) included in $M_{TOP}$ and power supply wirings ($V_{CC2}$ and $V_{SS2}$) included in $M_{TOP-1}$ are arranged to cross each other.

FIG. 2 is a conceptual top view showing a wiring arrangement that the power supply wirings ($V_{CC1}$ and $V_{SS1}$) included in the $M_{TOP}$ layer and the power supply wirings ($V_{CC2}$ and $V_{SS2}$) included in the $M_{TOP-1}$ layer are arranged to cross each other. FIG. 2 shows the case that the power supply wirings ($V_{CC1}$ and $V_{SS1}$) included in the $M_{TOP}$ layer and the power supply wirings ($V_{CC2}$ and $V_{SS2}$) included in the $M_{TOP-1}$ layer substantially perpendicularly cross each other. In other embodiments the power supply wirings included in each layers of $M_{TOP}$ and $M_{TOP-1}$, may cross obliquely at a predetermined angle of less than 90°. Although in FIG. 2, the power supply wirings ($V_{CC}$ and $V_{SS}$) for different potentials included in each of the layers of the $M_{TOP}$ and $M_{TOP-1}$ are alternately disposed, other embodiments are not limited to this arrangement, and may be appropriately changed according to the limitations caused by the design of the semiconductor integrated circuit or some other reasons.

In the exemplary wiring arrangement shown in FIG. 2, contacts are provided through the insulating film in the regions held between the power supply wirings for supplying the same potential to the circuit formed on the surface of the semiconductor substrate so that the power supply wirings for the same potential are electrically conducted. Namely, in FIG. 2, contacts 3c are provided through the insulating film in the regions held between the power supply wirings $V_{CC1}$ included in the $M_{TOP}$ layer and the power supply wirings $V_{CC2}$ included in the $M_{TOP-1}$ layer in order to electrically conduct both the power supply wirings $V_{CC1}$ and $V_{CC2}$. Also, contacts 3s are provided through the insulating film in the regions held between the power supply wirings $V_{ss1}$ included in the $M_{TOP}$ layer and the power supply wirings $V_{ss2}$ included in the $M_{TOP-1}$ layer in order to electrically conduct both the power supply wirings $V_{ss1}$ and $V_{ss2}$. It is preferable to provide as many contacts as possible in the available regions in order to secure power supply abilities supplied by each power supply wiring.

In the exemplary embodiment shown in FIG. 2, capacitors are formed in the regions held between the power supply wirings for supplying different potentials to the circuit formed on the surface of the semiconductor substrate 1. The "regions held between the power supply wirings for supplying different potentials" in FIG. 2 corresponds to the regions held between the power supply wirings $V_{cc1}$ included in the $M_{TOP}$ layer and the power supply wirings $V_{ss2}$ included in the $M_{TOP-1}$ layer, and the regions held between the power supply wirings $V_{ss1}$ included in the $M_{TOP}$ layer and the power supply wirings $V_{cc2}$ included in the $M_{TOP-1}$ layer. The regions also corresponds to the regions held between the adjacent power supply wirings included in a same wiring layer when the power supply wirings for supplying different potentials are adjacent to each other in the same wiring layer.

The capacitors between the $M_{TOP}$ layer and the $M_{TOP-1}$ layer function as buffer in stabilizing a power supply voltage against an instantaneous power consumption which may occur in the semiconductor integrated circuit. The capacitors also have the effect of avoiding defects such as jitter in an output signal. The required capacitance of the capacitors for effectively functioning as a buffer depends on the specifications and operating environment of the semiconductor integrated circuit. For example, when the semiconductor integrated circuit operates at a low power supply voltage and a high speed, the capacitance of the capacitors is preferably 1 nF/mm² or more per chip unit area. The capacitance of the capacitors to be formed is preferably as large as possible.

As described above, the capacitors formed between the metal wiring layers of $M_{TOP}$ and $M_{TOP-1}$ can be formed in the regions held between the power supply wirings $V_{cc1}$ included in the $M_{TOP}$ layer and the power supply wirings $V_{ss2}$ included in the $M_{TOP-1}$ layer, and in the regions held between the power supply wirings $V_{ss1}$ included in the $M_{TOP}$ layer and the power supply wirings $V_{cc2}$ included in the $M_{TOP-1}$ layer. When the power supply wirings for supplying different potentials are adjacent to each other in a same wiring layer, the capacitors can also be formed in the regions held between the adjacent power supply wirings in the same wiring layer.

However, the capacitance of the capacitors formed in the regions held between the adjacent power supply wirings is as small as a fraction or less of the capacitance of the capacitors formed between the layers of $M_{TOP}$ and $M_{TOP-1}$, when the power supply wirings for supplying different potentials are adjacent to each other in a same wiring layer. This is because wiring generally has a longer length in the width direction than in the thickness direction, and the distance between wiring layers can be manufactured smaller than that between wirings in the same wiring layer from the viewpoint of the manufacturing technology problem etc.

FIG. 3 shows an exemplary method for forming the metal wiring layers of $M_{TOP}$ and $M_{TOP-1}$. Although FIG. 3 shows a dual damascene method for forming the metal wiring layers of $M_{TOP}$ and $M_{TOP-1}$ using a copper process, the various embodiments described herein are not limited to this method. Instead of the method disclosed in FIG. 3, other dual damascene methods and other wiring methods can be used. An exemplary method for forming the metal wiring layers of $M_{TOP}$ and $M_{TOP-1}$ is explained below with reference to FIG. 3.

Figure 3A:
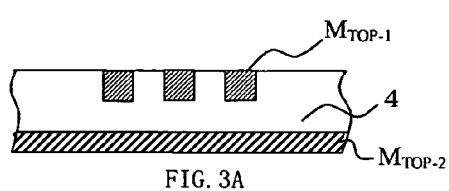
FIGS. 3A to 3E are side views showing an example of a method for forming $M_{TOP}$ and $M_{TOP-1}$.

As shown in FIG. 3A, first, the next-to-top metal wiring layer of $M_{TOP-1}$ is formed on a metal wiring layer of $M_{TOP-2}$ (located directly below $M_{TOP-1}$) with an insulating film 4 disposed between them. As the insulating film 4, a $SiO_2$ film may be formed by a CVD process. After the insulating film 4 is deposited on the metal wiring layer of $M_{TOP-2}$, the surface of the insulating film 4 is smoothed by a CMP process, and then the next-to-top metal wiring layer of $M_{TOP-1}$ is formed by the damascene method using copper, for example.

Figure 3B:
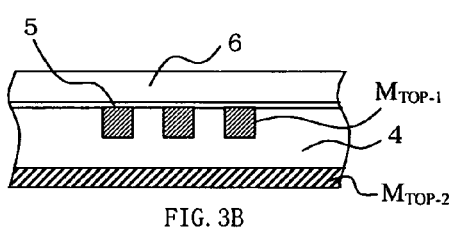

Next, as shown in FIG. 3B, an insulating film 5 is deposited on the next-to-top metal wiring layer of $M_{TOP-1}$ for use as an insulating film between the metal wiring layers of $M_{TOP}$ and $M_{TOP-1}$. Then, a $SiO_2$ film 6 is deposited on the insulating film 5. The insulating film 5 serves as an insulating layer for forming the capacitors between the metal wiring layers of $M_{TOP}$ and $M_{TOP-1}$. Therefore, in order to secure the capacitance of the capacitor, the insulating film 5 is preferably thinner than any other insulating films held between wiring layers of $M_{TOP}$ and $M_{TOP-1}$, and is as thin as possible. Preferably, the thickness of the insulating film is 1/10 or less of the thickness of insulating films between conventional metal wiring layers of $M_{TOP}$ and $M_{TOP-1}$.

As a material for the insulating film 5, an oxide film (such as $SiO_2$ film) having a dielectric constant of about 4 can be used. However, a SiN film with a dielectric constant of about 8 or a $Ta_2O_5$ film with a dielectric constant of about 25, for example, can also be used as a material having a higher dielectric constant thereby increasing the capacitance with the same thickness.

When copper is used for the next-to-top metal wiring layer of $M_{TOP-1}$, the insulating film 5 is also required to function as a diffusion barrier film for preventing copper diffusion. Thus a SiN film or SiC film may be more suitable as the material for the insulating film 5. Furthermore, the thickness of the insulating film 5 is preferably in the range of about 30 nm to about 100 nm.

Figure 3C:
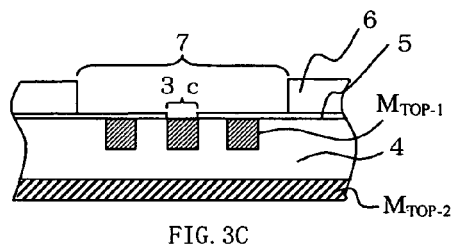

Next, as shown in FIG. 3C, contacts 3c for connecting power supply wirings of the same potential are formed in the insulating film 5 by etching, and grooves 7 for wiring portions of the metal wiring layer of $M_{TOP}$ are formed in the $SiO_2$ film 6. The contacts 3c and the grooves 7 can be formed by any one of the various methods that are known in the dual damascene method.

Figure 3D:
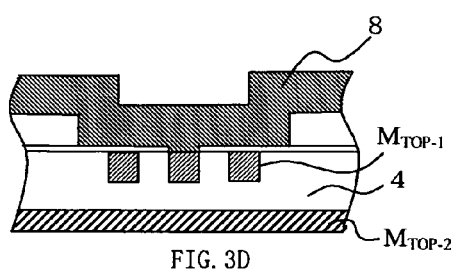

Next, as shown in FIG. 3D, a metal film 8 for forming the metal wiring layer $M_{TOP}$ is buried in the contacts 3c and the grooves 7. For example, the method of burying copper by electrolytic plating can be applied.

Figure 3E:
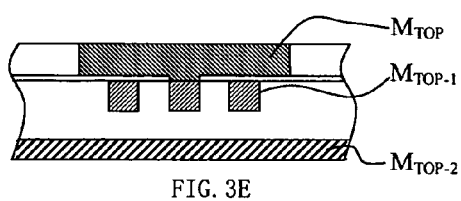

Finally, as shown in FIG. 3E, unnecessary portions of the buried metal film 8 (in this case, copper) are removed by a CMP process to form the metal wiring layer of $M_{TOP}$.

In the embodiment, as shown in FIG. 3E, the capacitors are formed in the regions held between the power supply wirings $V_{CC1}$ included in the $M_{TOP}$ layer and the power supply wirings $V_{SS2}$ included in the $M_{TOP-1}$ layer. In the case shown in FIG. 3E, the capacitors can be formed between the power supply wirings $V_{CC2}$ and $V_{SS2}$ included in the $M_{TOP-1}$ layer, but the capacitance of the capacitors is significantly smaller than that of the capacitors formed in the regions held between the power supply wirings $V_{CC1}$ included in the $M_{TOP}$ layer and the power supply wirings $V_{SS2}$ included in the $M_{TOP-1}$ layer.

As described above, the capacitors are mainly formed in the regions held between the power supply wirings $V_{CC1}$ included in the $M_{TOP}$ layer and the power supply wirings $V_{SS2}$ included in the $M_{TOP-1}$ layer. Also, the capacitors are formed in the regions held between the power supply wirings $V_{SS1}$ included in the $M_{TOP}$ layer and the power supply wirings $V_{CC2}$ included in the $M_{TOP-1}$ layer.

In this structure of the present invention, one method by which the capacitance of the capacitors required for stabilizing the power supply voltage can be secured. That is, the top metal wiring layer of $M_{TOP}$ and the next-to-top metal wiring layer of $M_{TOP-1}$, which is located directly below $M_{TOP}$, are exclusively used for the power supply wirings ($V_{CC}$ and $V_{SS}$), but not used for signal wirings. As used herein, the expression "exclusively used for the power supply wirings ($V_{CC}$ and $V_{SS}$)" means that the metal wiring layers of $M_{TOP}$ and $M_{TOP-1}$ are mainly used for power supply wirings but not used for signal wirings. Other elements such as pads for connecting to signal lines formed in a circuit area of lower layers may be formed in one or both of these metal wiring layers. Alternatively, the expression "exclusively used for the power supply wirings ($V_{CC}$ and $V_{SS}$)" means that power supply wirings and signal wirings are not mixed in the same wiring layer.

It is possible to decrease the thickness of the interlayer film between the metal wiring layers of $M_{TOP}$ and $M_{TOP-1}$ and increase the dielectric constant of the interlayer film, because signal wirings are not formed in $M_{TOP}$ and $M_{TOP-1}$. As a result, the capacitance of the capacitors formed between the metal wiring layers of $M_{TOP}$ and $M_{TOP-1}$ can be increased, and the power supply capacitance for stabilizing the power supply voltage can be secured. When signal wirings are formed in $M_{TOP}$ and $M_{TOP-1}$, on the contrary, it is impossible to decrease the thickness and increase the dielectric constant of the interlayer film, because it is required to decrease the capacitance of signal wirings in order to increase the operation speed of the semiconductor integrated circuit.

When a conventional $SiO_2$ insulating film having a thickness of 1 μm is used, a capacitance of 1 $nF/mm^2$ per chip unit area cannot be obtained. For example, the upper limit of the capacitance of the whole chip with dimensions of 5 mm×5 mm is actually 2 nF to 3 nF, and thus the upper limit of the capacitance per chip unit area is about 0.1 $nF/mm^2$. In general, a value obtained by dividing the dielectric constant by the thickness (dielectric constant/thickness) is preferably larger than that between any other metal wiring layers. In fact, it is preferable that the thickness is smaller than that of any other layers, and the dielectric constant is larger than that of any other layers.

The above description is the case in which the capacitors are formed between the top metal wiring layer of $M_{TOP}$ and the next-to-top metal wiring layer of $M_{TOP-1}$, which is located directly below $M_{TOP}$. The capacitors may be, however, further formed between the metal wiring layer $M_{TOP-1}$ and a lower metal wiring layer $M_{TOP-2}$ provided below it. In this case, the secured capacitance is about 2 times as large as that of the capacitors formed between the metal wiring layers of $M_{TOP}$ and $M_{TOP-1}$.

In the present embodiment, the metal wiring layer $M_{TOP}$ is expressed as a top layer. The metal wiring layer $M_{TOP}$, however, may not be the top layer in a strict sense. The semiconductor integrated circuit may also has, for example, a wiring layer for forming bumps over the metal wiring layer $M_{TOP}$. Of course, this case is included in the present invention. In other words, the term "the top layer" means that there is no metal wiring layer on the metal wiring layer $M_{TOP}$ except a bump wiring layer.

In the method disclosed in JP 2002-270771, two wiring layers are added for applying a capacitor between a power supply and the ground potentials. In the embodiment shown herein, however, such wiring layers are not provided, but both the top layer and the layer directly under the top layer (i.e., the top two layers), which are conventionally used for both signals and power supply wirings, are exclusively used for the power supply wirings.

Also, in the present invention, even when the top two layers are exclusively used for the power supply wirings, signal wirings can be provided in the third layer or below from the top layer with the recent technology of the semiconductor integrated circuit, which enables manufacture of the multi-layer wiring structure.

What is claimed is:

1. A semiconductor integrated circuit having a multilayer wiring structure, comprising:
   circuit elements formed on a semiconductor substrate;
   a top metal wiring layer ($M_{TOP}$) including a plurality of top layer power supply wirings extending in a first direction, and a next-to-top metal wiring layer ($M_{TOP-1}$) directly below the top metal wiring layer $M_{TOP}$ including a plurality of next-to-top layer power supply wirings extending in a second direction, each of the top layer and the next-to-top layer power supply wirings including a plurality of first potential wirings for supplying a first potential to the circuit elements and a plurality of second potential wirings for supplying a second potential to the circuit elements, wherein each of the plurality of top layer power supply wirings crosses each of the plurality of next-to-top layer power supply wirings with a top layer insulating film between them; and
   a plurality of first contacts provided in the insulating film for connecting the first potential wirings in the top and the next-to-top metal wiring layers with each other and a plurality of second contacts provided in the insulating film for connecting the second potential wirings in the top and the next-to-top metal wiring layers with each other.

2. The semiconductor integrated circuit according to claim 1, further comprising a plurality of lower metal wiring layers below the next-to-top metal wiring layer,
   wherein capacitance per unit area formed between the top layer power supply wirings and the next-to-top layer power supply wirings is larger than a capacitance per unit area between wirings of any two of the metal wiring layers other than the top metal wiring layer $M_{TOP}$ and the next-to-top metal wiring layer $M_{TOP-1}$.

3. The semiconductor integrated circuit according to claim 1, wherein capacitance per unit area between the top layer power supply wirings and the next-to-top layer power supply wirings is 1 nF/mm$^2$ or more.

4. The semiconductor integrated circuit according to claim 1, wherein the top metal wiring layer $M_{TOP}$ and the next-to-top metal wiring layer $M_{TOP-1}$ are used exclusively for forming the power supply wirings and optionally for forming pads.

5. The semiconductor integrated circuit according to claim 1, wherein a thickness of the top layer insulating film is 30 to 100 nm.

6. The semiconductor integrated circuit according to claim 1, further comprising a plurality of lower metal wiring layers below the next-to-top metal wiring layer and lower layer insulating films between respective adjacent ones of the lower metal wiring layers, and a middle layer insulating film between a top-most one of the lower wiring layers and the next-to-top metal wiring layer,
   wherein each of the top layer, the middle layer, and the lower layer insulating films has a thickness and a dielectric constant, and a ratio between the dielectric constant and the thickness of the top layer insulating film is higher than the ratio of any one of the middle and the lower layer insulating films.

7. The semiconductor integrated circuit according to claim 6, wherein the thickness of the top layer insulating film is thinner than the thickness of any one of the middle and the lower layer insulating films.

8. The semiconductor integrated circuit according to claim 6, wherein the dielectric constant of the top layer insulating film is higher than the thickness of any one of the middle and the lower layer insulating films.

9. The semiconductor integrated circuit according to claim 1, further comprising a plurality of lower metal wiring layers below the next-to-top metal wiring layer and lower layer insulating films between respective adjacent ones of the lower metal wiring layers, and a middle layer insulating film between a top-most one of the lower wiring layers and the next-to-top metal wiring layer,
   wherein each of the top layer, the middle layer, and the lower layer insulating films has a thickness and dielectric constant, and a ratio between the dielectric constant and the thickness of the top later insulating film is higher than the ratio of any one of the middle and the lower layer insulating films.

10. The semiconductor integrated circuit according to claim 9, wherein the thickness of the top layer insulating film is thinner than the thickness of any one of the middle and the lower layer insulating films.

11. The semiconductor integrated circuit according to claim 9, wherein the dielectric constant of the top layer insulating film is higher then the thickness of any one of the middle and the lower layer insulating films.

12. The semiconductor integrated circuit according to claim 2, wherein capacitance per unit area between the top layer power supply wirings and the next-to-top layer power supply wirings is 1 nF/mm$^2$ or more.

13. The semiconductor integrated circuit according to claim 3, wherein the top metal wiring layer $M_{TOP}$ and the next-to-top metal layer $M_{TOP-1}$ are sued exclusively for forming the power supply wirings and optionally for forming pads.

14. The semiconductor integrated circuit below the next-to-top metal wiring layer,
   wherein the capacitance per unit area formed between the top layer power supply wirings and the next-to-top layer power supply wirings is larger than a capacitance per unit area between wirings of any two of the metal wiring layers other than the top metal wiring layer $M_{TOP}$ and the next-to-top metal wiring layer $M_{TOP-1}$,
   wherein the top metal wiring layer $M_{TOP}$ and the next-to-top metal wiring layer $M_{TOP-1}$ are used exclusively for forming the power supply wirings and optionally for forming pads.

15. The semiconductor integrated circuit according to claim 2,
   wherein the top metal wiring layer $M_{TOP}$ and the next-to-top metal wiring layer $M_{TOP-1}$ are used exclusively for forming the power supply wirings and optionally for forming pads.

* * * * *